(12) United States Patent
Wallerstein

(10) Patent No.: US 10,489,532 B1
(45) Date of Patent: Nov. 26, 2019

(54) APPARATUSES AND METHODS FOR CONNECTOR STIFFNESS MANAGEMENT

(71) Applicant: MSC.Software Corporation, Newport Beach, CA (US)

(72) Inventor: David Vandermere Wallerstein, Pasadena, CA (US)

(73) Assignee: MSC.SOFTWARE CORPORATION, Newport Beach, CA (US)

( * ) Notice: Subject to any disclaimer, the term of this patent is extended or adjusted under 35 U.S.C. 154(b) by 448 days.

(21) Appl. No.: 14/861,950

(22) Filed: Sep. 22, 2015

(51) Int. Cl.
*G06G 7/48* (2006.01)
*G06F 17/50* (2006.01)

(52) U.S. Cl.
CPC .................... *G06F 17/5018* (2013.01)

(58) Field of Classification Search
None
See application file for complete search history.

(56) References Cited

U.S. PATENT DOCUMENTS

| | | | |
|---|---|---|---|
| 6,208,146 B1 * | 3/2001 | Huang | G01R 27/205 219/109 |
| 7,308,387 B1 * | 12/2007 | Feng | G06F 17/5018 703/1 |
| 7,440,879 B2 * | 10/2008 | Breitfeld | G06F 17/5018 703/2 |
| 9,098,648 B2 * | 8/2015 | Roy | G06F 17/50 |
| 2006/0217942 A1 * | 9/2006 | Daferner | B60R 25/24 703/2 |

OTHER PUBLICATIONS

"Marc®2010 vol. C: Program Input. MSC Software". 2010 MSC. Software Corporation. 1861 pages.*
Fang, J., et al. "1 Weld Modeling with MSC. Nastran." (2000).*
"Simulating Reality", MSC Software Magazine. vol. I, Winter 2011. 36 pages.*

* cited by examiner

*Primary Examiner* — Rehana Perveen
*Assistant Examiner* — Nithya J. Moll
(74) *Attorney, Agent, or Firm* — Foley & Lardner LLP

(57) ABSTRACT

Apparatuses and methods are described herein for controlling stiffness associated with a connector connecting two or more components of a model, including, but not limited to, receiving user input of a scaling factor and adjusting the stiffness associated with the connector by adjusting a bending moment of inertia of a patch of one of the two or more components based on the scaling factor. The connector contacts the one of the two or more components at the patch.

16 Claims, 7 Drawing Sheets

APPARATUSES AND METHODS FOR CONNECTOR STIFFNESS MANAGEMENT

BACKGROUND

1. Field

The present disclosure relates generally to Finite Element Method (FEM), and particularly, to modeling and simulating stiffness associated with connectors in a Finite Element (FE) model.

2. Background

Connectors are elements used to connect and hold various structural components of a model together in a FEM analysis. In some embodiments, connectors are used to represent structural welds on machine parts of automobiles, trains, ships, aircrafts, and the like. In further embodiments, the connectors are used to represent other types of structural connections such as, but not limited to, kinematic constraints, kinematic joints, contact and glue interactions, bolts, and the like. Generally, connectors are excellent elements for load transferring between the structural components joined by the connectors.

However, contribution of the connectors for local non-load transfer-type stiffness can be contingent on a FEM Discretization Process, thus causing certain loss of attributes associated with the connectors. Such a lost attribute can be stiffness associated with the connector and/or patches of the structural elements joined by the connector. A patch can be an area of the structural component contacting the connector. The stiffness (caused by the connector) associated with the patch can noticeably influence simulation results of the model as a whole. Conventionally, the stiffness for a same patch can be different based on how fine the mesh is. For instance, a finer mesh can cause a patch to be stiffer (in bending) than a corresponding patch of a corresponding model using a coarser mesh. The opposite is true in other embodiments. A method is needed to adjust the stiffness of a patch virtually such that the simulated results can better correlate with the physical test results (colloquially, real-life test results).

In a specific example concerning a large body in a white car model, a patch in a finer 5-mm mesh can be more flexible (less stiff) than another corresponding patch in a coarser 8-mm mesh. However, actual physical test results can correspond better with the simulation results in the 8-mm mesh. Thus, a method is needed to provide additional stiffness to the 5-mm mesh to better correlate to the actual physical test results while maintaining usage of the 5-mm mesh.

SUMMARY OF THE INVENTION

Embodiments described herein relate to apparatuses and methods for adjusting and managing stiffness associated with patches of structural elements connected by a connector. The connector contacts the structural elements at a patch of each of the structural elements. The patch can include shell elements, each of which can include at least one mesh element (or a surface thereof). Embodiments described herein relate to adjusting a bending ratio moments of inertia of the shell elements based on a scaling factor. The scaling factor can be set based on user input in the manner described.

According to various embodiments, a method is described herein for controlling stiffness associated with a connector connecting two or more components of a model, the method including, but not limited to, receiving user input of a scaling factor and adjusting stiffness associated with the connector by adjusting a bending moment of inertia of a patch of one of the two or more components based on the scaling factor. The connector contacts the one of the two or more components at the patch.

In some embodiments, anon-transitory computer-readable medium for storing computer-readable instructions is described, when the instructions are executed, a processor is caused to perform a method for controlling stiffness associated with a connector connecting two or more components of a model, the method including, but not limited to, receiving user input of a scaling factor and adjusting stiffness associated with the connector by adjusting a bending moment of inertia of a patch of one of the two or more components based on the scaling factor. The connector contacts the one of the two or more components at the patch.

According to some embodiments, a method for controlling stiffness associated with a connector connecting two or more components of a model is described, the method including, but not limited to, adjusting the stiffness associated with the connector in the simulated model by adding an adjusted bending moment of inertia associated with the connector and tuning the adjusted bending moment of inertia by receiving user input of a scaling factor used to compute the adjusted bending moment of inertia.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

Figure 1:
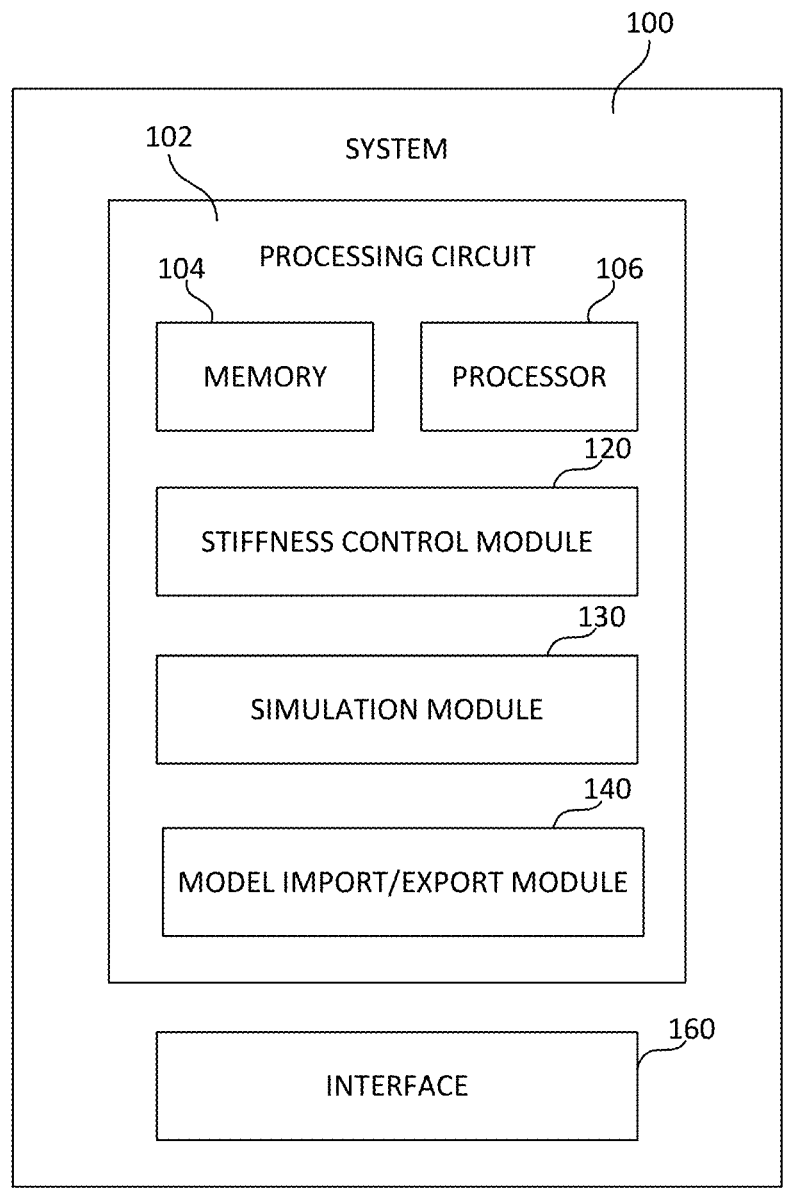
FIG. 1 is a block diagram illustrating an example of a stiffness management system according to various embodiments.

The detailed description set forth below in connection with the appended drawings is intended as a description of various aspects of the present disclosure and is not intended to represent the only aspects in which the present disclosure can be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure can be practiced without these specific details. In some instances, structures and devices are shown in block diagram form in order to avoid obscuring the concepts of the present disclosure. Acronyms and other descriptive terminology can be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with one or more aspects.

Apparatuses and methods are described herein for providing a stiffness control mechanism for connectors in virtual model representation of physical objects. Particularly, an user interface can be provided to allow a user to adjust the stiffness associated with one or more connectors of the model. The stiffness control mechanism can be based on patch bending/torsion correction as described herein. The simulation results (e.g., Finite Element Method (FEM) solution) can accordingly better correlate with the physical test results, as the stiffness due to the connector can now be controlled. Generally, the stiffness control mechanism can automatically compute parameters used to stiffen or relax patches based on user input. Given that the stiffness can be adjusted by the user, the stiffness control mechanism does not add significant time to the FEM solution time.

Each structural component connected by a connector can have a patch. A patch can be an area of the structural component that contacts the connector. The patch can include one or more shell elements. Each shell element can correspond to at least one mesh element. Accordingly, a size (e.g., area) of a shell element can be based on the mesh discretization process, as a number or size of the mesh elements can influence the size of the shell element. The shell elements can automatically be determined (e.g., by projecting auxiliary points).

Generally, the stiffness control mechanism can be embodied in:

$$J_{total} = J_{shell} + J_{connector} \quad (1);$$

where $J_{total}$ is a total bending moment of inertia associated with shell elements of the patch. $J_{shell}$ is a conventional bending moment of inertia associated with the one or more shell elements. $J_{connector}$ is an adjusted bending moment of inertia associated with the connector contacting the patch.

$J_{connector}$ can be adjusted by a user in a manner such as, but is not limited to:

$$J_{connector} = SCL_{skin} \cdot \frac{A_{patch}}{A_{connector}}; \quad (2)$$

where $SCL_{skin}$ can be a scaling factor (variable) adjustable by the user to scale $J_{connector}$. Particularly, the user can fine-tune $SCL_{skin}$ for obtaining a desired result. When the stiffness control mechanism is not turned on, $SCL_{skin}$ can be set to 0 as default. When $SCL_{skin}$ is set to 0, $J_{connector}$ can equal to 0, and $J_{total}$, in turn, can equal to $J_{shell}$, which can be the conventional value without stiffness adjustment. $A_{patch}$ can be an area of the patch or a portion thereof (e.g., the sum of the area of the shell elements associated with the connector). $A_{connector}$ can be an area (e.g., cross-section) of the connector that contacts the patch. For example, where $A_{connector}$ is a circle, $A_{connector}$ can be $\pi d^2/4$, where d is the diameter of the circle.

The adjusted bending moment of inertia of the connector ($J_{connector}$) can be a ratio of a moment of inertia of the patch ($I_{patch}$) over a moment of inertia of the connector ($I_{connector}$), i.e., $$J_{connector} = \frac{I_{patch}}{I_{connector}}; \quad (3)$$

where, $$I_{patch} = A_{patch} \cdot (D_{patch})^2 \quad (4);$$

and $$I_{connector} = A_{connector} \cdot (D_{connector})^2 \quad (5);$$

$D_{patch}$ can be a unknown transfer distance of the shell elements of the patch. $D_{connector}$ can be a transfer distance of the connector. The transfer distance of the connector can typically be approximately half of a distance between a top and bottom patches. Therefore, $$SCL_{skin} = \frac{(D_{patch})^2}{(D_{connector})^2}. \quad (6)$$

$SCL_{skin}$ can represent a ratio of the unknown square of the transfer distance of the shell element(s) to the square of the transfer distance of the connector, conceptually. In practice, $SCL_{skin}$ can be a single parameter configurable by the user. In other words, the user can be allowed to adjust the bending moment of inertia of the shell elements associated with the patch (through adjusting $SCL_{skin}$) for obtaining simulation results that are consistent with the physical test results.

FIG. 1 is a block diagram illustrating an example of a stiffness management system 100 according to various embodiments. Referring to FIG. 1, the stiffness management system 100 can include at least a stiffness control module 120, a simulation module 130, and a model import/export module 140, to implement features described herein. In particular, each of the stiffness control module 120, simulation module 130, and model import/export module 140 can be a module configured to virtually perform stiffness adjustment and management functionalities described herein. The stiffness management system 100 can be executed for the Finite Element Analysis (FEA) and other suitable simulation platforms.

The stiffness management system 100 can include a processing circuit 102 and an interface 160. The processing circuit 102 can be part of a workstation computer or other suitable types of computing device. The processing circuit 102 can include the various modules 120, 130, and 140 for executing various functions described herein. The processing circuit 102 can also include a memory 104 and processor 106. The stiffness management system 100 can include other devices such as a network system, wireless or wired communications systems, printers, and/or the like for performing various functions described herein.

The processor 106 can include any suitable data processing device, such as a general-purpose processor (e.g., a microprocessor). But in the alternative, the processor 106 can be any conventional processor, controller, microcontroller, or state machine. The processor 106 can also be implemented as a combination of computing devices, e.g., a combination of a Digital Signal Processor (DSP) and a microprocessor, a plurality of microprocessors, at least one microprocessors in conjunction with a DSP core, or any other such configuration. For example, the processor 106 can be, but is not limited to being, an Intel® designed processor, AMD® designed processor, Apple® designed processor, QUALCOMM® designed processor, or ARM® designed process. The processor 106 can be used to implement features of the various modules 120, 130, and 140.

The memory 104 (or storage device) can be operatively coupled to the processor 106 and can include any suitable device for storing software instructions and data for controlling and use by the processor 106 to perform operations and functions described herein, including, but not limited to, Random Access Memory (RAM), Read Only Memory (ROM), floppy disks, hard disks, dongles or other Recomp Sensor Board (RSB) connected memory devices, or the like. The memory 104 can include non-transitory storage media that is configured to store information regarding a geometric model that is being currently modified or was created in the past and/or computer readable instructions for the processes performed by the processor 106 as described.

The memory 104 can send data to or receive data from the processor 106 and/or each of the modules/components in the stiffness management system 100. In some embodiments, the memory 104 can be a remote storage device that stores data for the stiffness management system 100 (or only the processing circuit 102) in a different node of a network from the processing circuit 102 and/or the stiffness management system 100. In other embodiments, the memory 104 can be located on the same computer system (e.g., within the same node of the network) as the processing circuit 102 and/or the stiffness management system 100. In other embodiments, one or more of the various modules 120, 130, and 140 can be implemented with a dedicated memory unit (separate from the memory 104) such as, but not limited to, the memory 104.

The processor 106 can be coupled to one or more of all of the modules 120, 130, and 140 in the stiffness management system 100 for performing the functionalities of each of the coupled modules 120, 130, and 140. For example, the processor 106 can implement the stiffness control module 120 for adjusting stiffness for the shell elements of the patch of the structural element. In some embodiments, the stiffness control module 120 can be coupled to the user interface 160 for receiving user input (user-generated data) related to the scaling factor ($SCL_{skin}$). The processor 106 can implement the simulation module 130 to perform simulations and/or modifications of the imported model, based on the stiffness as adjusted by the stiffness control module 120. The processor 106 can implement the model import/export module 140 to import the model (including the structural elements, the patch associated therewith, and the connector). In other embodiments, the model import/export module 140 can be configured to import model data from another memory device or another system. The model import/export module 140 can send model information corresponding to the imported model to one or more or all of the modules 120, 130, and 140 in the stiffness management system 100. The model import/export module 140 can export the model with the stiffness adjusted.

The interface 160 can include at least one input device for receiving input from the user and at least one display device for relaying information to the user. For example, the input device can include a computer with a monitor, keyboard, keypad, mouse, joystick, touch screen display, or other input devices performing a similar function. The keyboard can include alphanumeric and other keys, and can be connected to processing circuit 102 (e.g., the processor 106 and the memory 104) for communicating information and command selections. The input device can include a touch screen interface or movement sensing interface that can be combined with, or separated from, the display device of the interface 160. The input device can include a cursor control device, such as, but not limited to, a mouse, trackball, touch screen, motion sensor, cursor direction keys, and the like. Such input device can control cursor movement on the display device. The display device of the interface 160 can be any type of display (e.g., CRT display, LCD display, etc.) configured to provide audio and/or visual output to the user.

Figure 2:
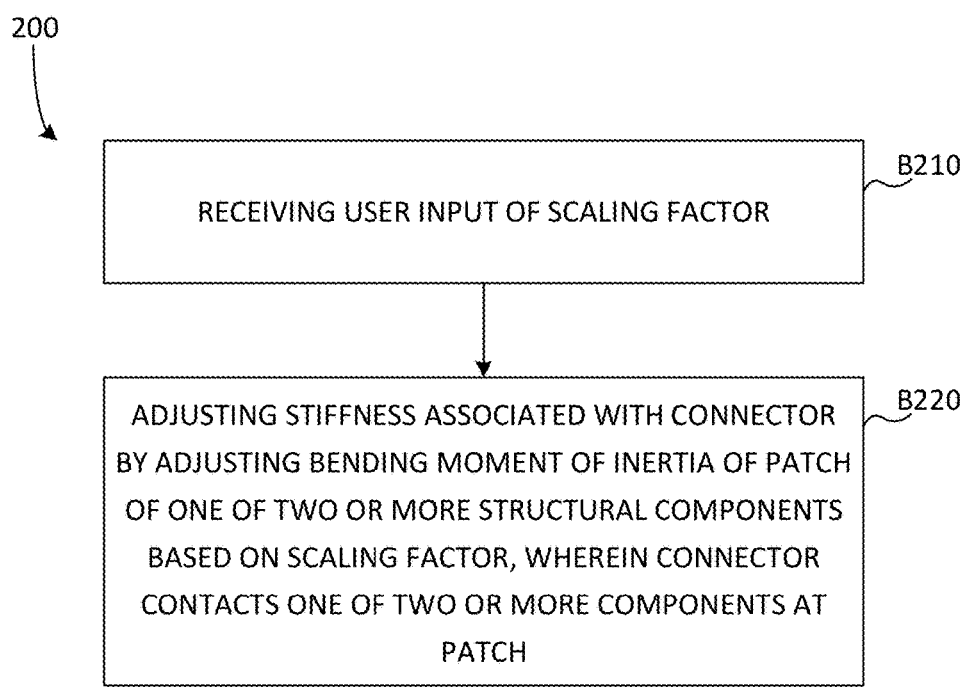
FIG. 2 is a process flow diagram illustrating an example of a stiffness management method for managing stiffness of a connector of a model according to various embodiments.

FIG. 2 is a process flow diagram illustrating an example of a stiffness management method 200 for managing stiffness of a connector of a model according to various embodiments. Referring to FIGS. 1-2, the stiffness control module 120 can receive user input of the scaling factor ($SCL_{skin}$) according to various embodiments. For example, the interface 160 can receive $SCL_{skin}$ from the user via the input device. The interface 160 can relate the user input to the stiffness control module 120.

At block B220, the stiffness control module 120 can adjust the stiffness associated with the connector by adjusting the total bending moment of inertia (e.g., $J_{total}$) of the patch of one of two or more structural components based on the scaling factor $SCL_{skin}$. The connector can contact the one of the two or more components at the patch. Particularly, the $J_{total}$ for shell elements can be adjusted by adding the modifying term $J_{connector}$ to the conventional term $J_{shell}$ according to equation (1). The modifying term $J_{connector}$ can be determined based on equation (2), in which $SCL_{skin}$ (received at block B210) is applied. $A_{connector}$ and $A_{patch}$ can be obtained automatically by the stiffness control module 120, as a function of the mesh.

In some embodiments, the scaling factor ($SCL_{skin}$) can be applied to a particular connector and its associated patch/shell elements. The particular connector can be selectable by the user via the interface 160. Each connector of the model can be associated with a different $SCL_{skin}$. In some embodiments, a same $SCL_{skin}$ can be applied to two or more connectors and their associated patch/shell elements. The two or more connectors can be selectable by the user via the interface 160. The two or more connectors can be associate with a same $SCL_{skin}$. In some embodiments, $SCL_{skin}$ can be applied globally to all connectors in the model and their associated patch/shell elements in the model. All connectors can have a same $SCL_{skin}$.

Figure 3A:
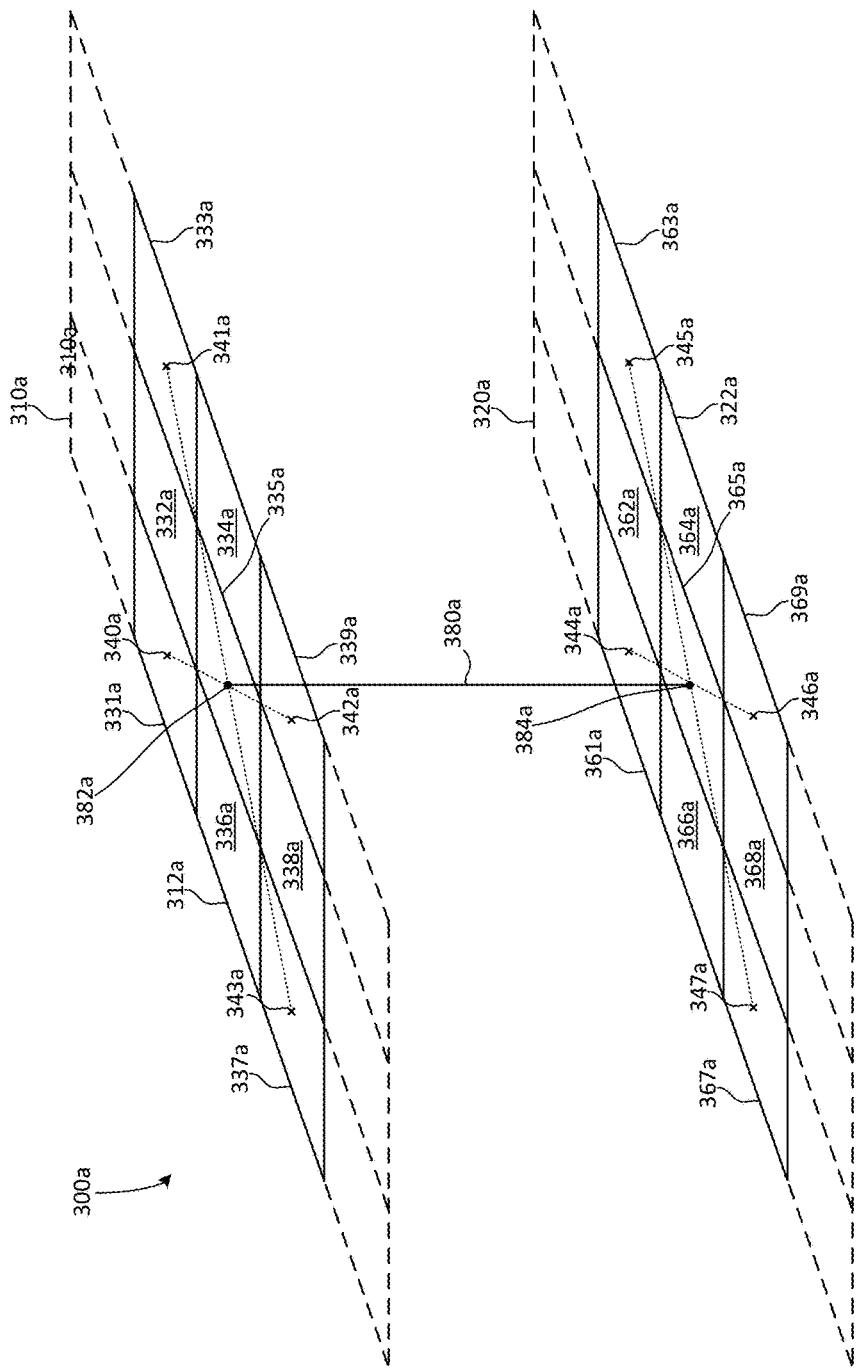
FIG. 3A is a diagram illustrating an example of patches and a connector that can implement the stiffness management method according to various embodiments.

FIG. 3A is a diagram 300a illustrating an example of patches (e.g., a first patch 310a and a second patch 320a) and a connector 380a that can implement the stiffness management method 200 according to various embodiments. Referring to FIGS. 1-3A, the first patch 310a can be a portion of a first structural element (not shown for clarity). The second patch 320a can be a portion of a second structural element (not shown for clarity). The patches 310a and 320a can be connected by the connector 380a. For clarity, the connector 380a is represented as a line in the diagram 300a. However, the connector 380a can be of any suitable 3-dimensional shape (such as, but not limited to, a cylinder, a cuboid, a cube, a virtual mathematical representation supplied by a direct stiffness input, or the like) with a cross-section having the area $A_{connector}$.

The connector 380a can contact the first patch 310a at a first contact point 382a. Based on the position of the first contact point 382a, the stiffness control module 120 can automatically project auxiliary points onto the first patch 310a. Illustrating with a non-limiting example, a first auxiliary point 340a, second auxiliary point 341a, third auxiliary point 342a, and fourth auxiliary point 343a can be projected onto the first patch 310a. The auxiliary points 340a-343a can define a first area 312a including 9 shell elements 331a-339a. The first area 321a can be $A_{patch}$ with respect to the first patch 310a and the first structural component associated therewith. Each of the shell elements 331a-339a can correspond to a mesh element in this non-limiting example. In other examples, each shell element can correspond to two or more mesh elements.

The connector 380a can contact the second patch 320a at a second contact point 384a. Based on the position of the second contact point 384a, the stiffness control module 120 can automatically project auxiliary points onto the second patch 320a. Illustrating with a non-limiting example, a fifth auxiliary point 344a, sixth auxiliary point 345a, seventh auxiliary point 346a, and eighth auxiliary point 347a can be projected onto the second patch 320a. The auxiliary points 344a-347a can define a second area 322a including 9 shell elements 361a-369a. The second area 322a can be $A_{patch}$ with respect to the second patch 320a and the second structural component associated therewith. Each of the shell elements 361a-369a can correspond to a mesh element in this non-limiting example. In other examples, each shell element can correspond to two or more mesh elements.

As shown in the non-limiting example with respect to diagram 300a, $A_{patch}$ may not equal to the area of the patch (e.g., the first or the second patch 310a or 320a). $A_{patch}$ can be based on an area (e.g., the first area 312a or the second area 322a) associated with the shell elements (e.g., the shell elements 331a-339a or the shell elements 361a-369a) defined by the auxiliary points (e.g., the auxiliary points 340a-343a or the auxiliary points 344a-347a). In other embodiments, $A_{patch}$ can be the area of the entire patch.

Figure 3B:
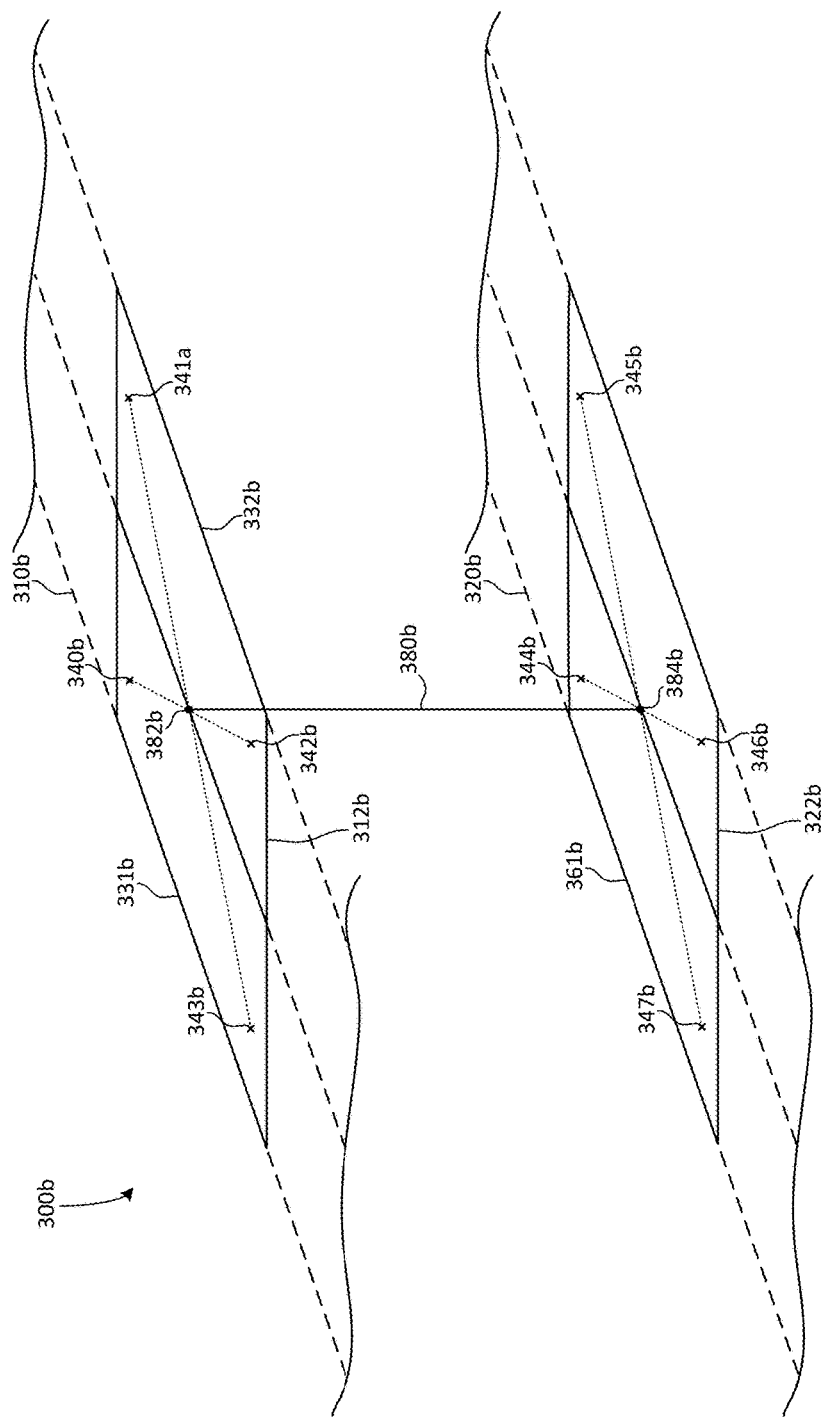
FIG. 3B is a diagram illustrating an example of patches and a connector that can implement the stiffness management method according to various embodiments.

FIG. 3B is a diagram 300b illustrating an example of patches (e.g., a first patch 310b and a second patch 320b) and a connector 380b that can implement the stiffness management method 200 according to various embodiments. Referring to FIGS. 1-3B, the first patch 310b can be a portion of a first structural element (not shown for clarity). The second patch 320b can be a portion of a second structural element (not shown for clarity). The patches 310b and 320b can be connected by the connector 380b. For clarity, the connector 380b is represented as a line in the diagram 300b. However, the connector 380b can be of any suitable 3-dimensional shape (such as, but not limited to, a cylinder, a cuboid, a cube, a virtual mathematical representation supplied by a direct stiffness input, or the like) with a cross-section having the area $A_{connector}$.

In some embodiments, the portion of the model shown in the diagram 300b can be the same portion of the same model shown in the diagram 300a, but in a coarser mesh. Particularly, the first and second patches 310b and 320b and the connector 380b can correspond to the first and second patches 310a and 320a and the connector 380a, respectively. The connectors 380a and 380b can have the same size and position (leading to same $A_{connector}$).

The connector 380b can contact the first patch 310b at a first contact point 382b. Based on the position of the first contact point 382b, the stiffness control module 120 can automatically project auxiliary points onto the first patch 310b. Illustrating with a non-limiting example, a first auxiliary point 340b, second auxiliary point 341b, third auxiliary point 342b, and fourth auxiliary point 343b can be projected onto the first patch 310b. The auxiliary points 340b-343b can define a first area 312b including 2 shell elements 331b-332b. The first area 321b can be $A_{patch}$ with respect to the first patch 310b and the first structural component associated therewith. Each of the shell elements 331b-332b can correspond to a mesh element in this non-limiting example.

The connector 380b can contact the second patch 320b at a second contact point 384b. Based on the position of the second contact point 384b, the stiffness control module 120 can automatically project auxiliary points onto the second patch 320b. Illustrating with a non-limiting example, a fifth auxiliary point 344b, sixth auxiliary point 345b, seventh auxiliary point 346b, and eighth auxiliary point 347b can be projected onto the second patch 320b. The auxiliary points 344b-347b can define a second area 322b including 2 shell elements 361b-362b. The second area 322b can be $A_{patch}$ with respect to the second patch 320b and the second structural component associated therewith. Each of the shell elements 361b-362b can correspond to a mesh element in this non-limiting example.

In the embodiments in which each of the shell elements 331a-339a, 361a-369a, 331b-332b, and 361b-362b include a single mesh element, the mesh elements shown in the diagram 300b are larger than the mesh elements shown in the diagram 300a. This is because the mesh Discretization Process caused the mesh in the diagram 300b to be courser than the mesh in the diagram 300a. The Discretization Process itself can cause the connector 380a (in the finer mesh) to be more or less stiff when bent (as simulated) as compared to the connector 380b (in the coarser mesh).

In some embodiments, the projection of auxiliary points can be the same regardless of mesh coarseness or mesh element size. That is the, positions of the auxiliary points 340a-347a can correspond to a respective one of the auxiliary points 340b-347b. In other embodiments, the projection of auxiliary points can be different based on the mesh coarseness or mesh element size. In either embodiments, $A_{patch}$ can be different for difference coarseness of meshes given that the position of the auxiliary points and/or the mesh element sizes can be different (i.e., $A_{patch}$ is a function of mesh element size). Nevertheless, the user can tune $SCL_{skin}$ to obtain a desired stiffness simulation results, by adjusting the conventional bending moment of inertia associated with the one or more shell elements ($J_{shell}$), for example, by adding the adjusted bending moment of inertia associated with the connector ($J_{connector}$), as described in equation (1).

Figure 4:
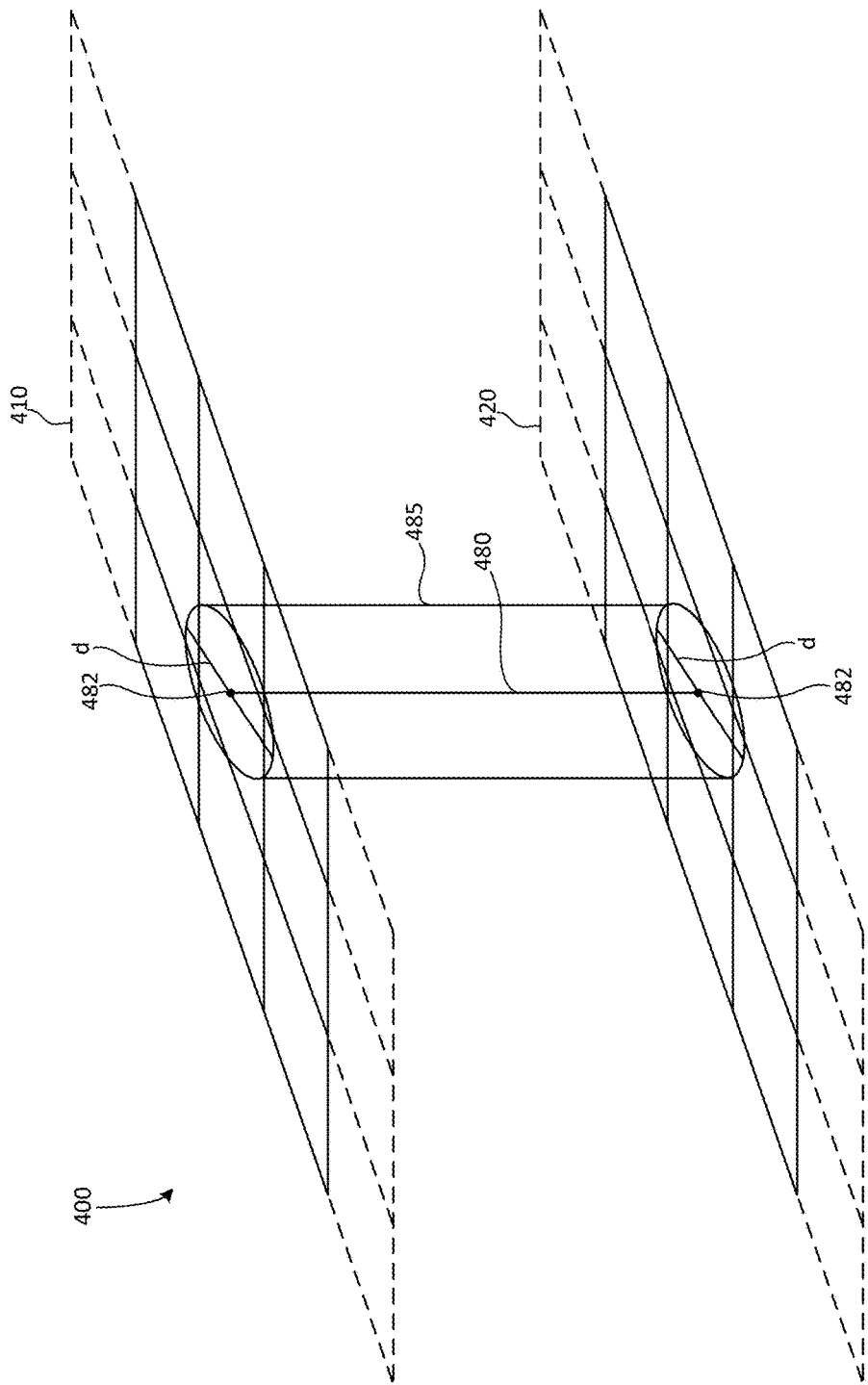
FIG. 4 is a diagram illustrating an example of patches and a connector that can implement the stiffness management method according to various embodiments.

FIG. 4 is a diagram 400 illustrating an example of patches (e.g., a first patch 410 and a second patch 420) and a connector 485 that can implement the stiffness management method 200 according to various embodiments. Referring to FIGS. 1-4, the diagram 400 can correspond to the diagram 300a and illustrates a 3-dimensional representation of the connector 485. For example, the first patch 410, the second patch 420, a first contact point 482, a second contact point 484, and a connector representation 480 can correspond to the first patch 310a, second patch 320a, first contact point 382a, second contact point 384a, and connector 380a, respectively.

The connector 485 is shown to have a cylindrical body, with a cross-section having a diameter d. Therefore, as shown in the non-limiting example in the diagram 400, $A_{connector}$ is be $\pi d^2/4$.

Figure 5:
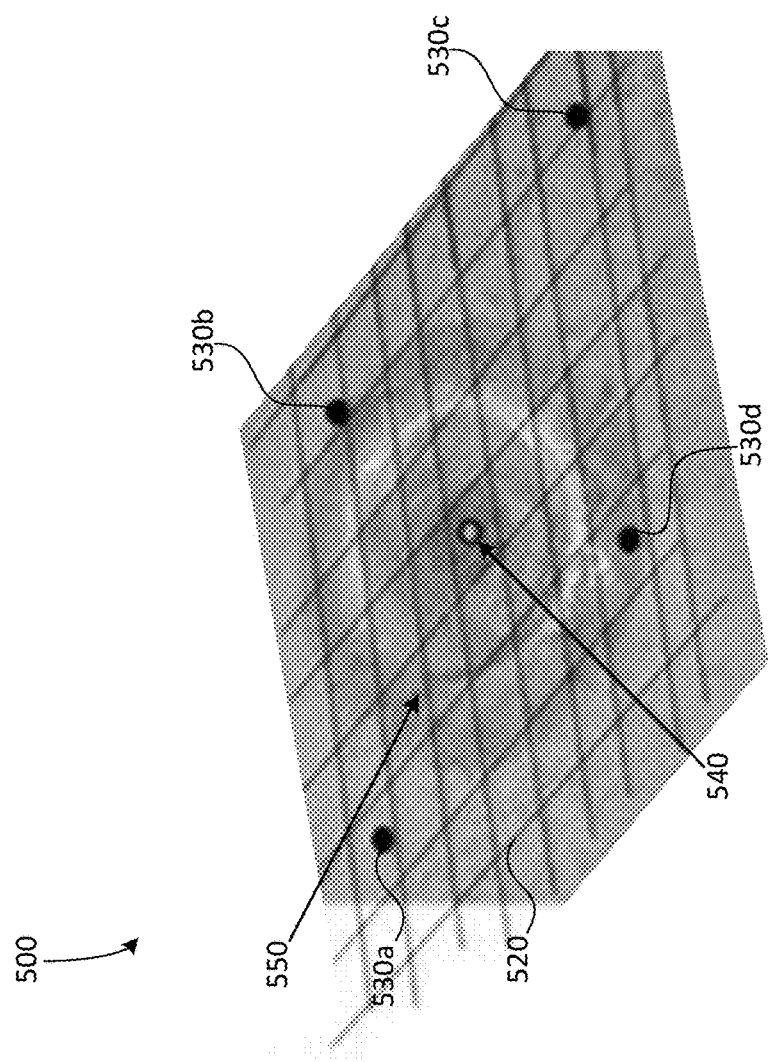
FIG. 5 is a diagram illustrating an example of a patch and a connector that can implement the stiffness management method according to various embodiments.

FIG. 5 is a diagram 500 illustrating an example of a patch 520 and a connector 510 that can implement the stiffness management method 200 according to various embodiments. Referring to FIGS. 1-5, the connector 510 may be a weld (for ground transport such as trains or automotives) or other types of a puddle of material. The connector 510 may be a 3-dimensional shape protruding from the contact point. In some embodiments, the welding is at least one of a rivet, plug-friction lock, lock-bolt-fastener, screw, discretized bolt or sheet spring nuts. The patch 520 may be defined by the grid, each partition of the grid can correspond to a shell element and/or a mesh element. Based on a position of a contact point 540, auxiliary points 530a-530d can be projected on the patch 520, in the manner described.

As described with reference to equation (3), the adjusted bending moment of inertia of the connector ($J_{connector}$) can be determined by dividing the moment of inertia of the patch ($I_{patch}$) by the moment of inertia of the connector ($I_{connector}$). At a dimpling position of the patch 520, the puddle of weld can be dimpled, causing the weld dimpling effect. The weld dimpling effect can be associated with the $I_{patch}$, and characterized by the equation (4). At the contact point 540, a connector load transfer effect can occur. The connector load transfer effect can be characterized by $I_{connector}$, defined by the equation (5).

Figure 6:
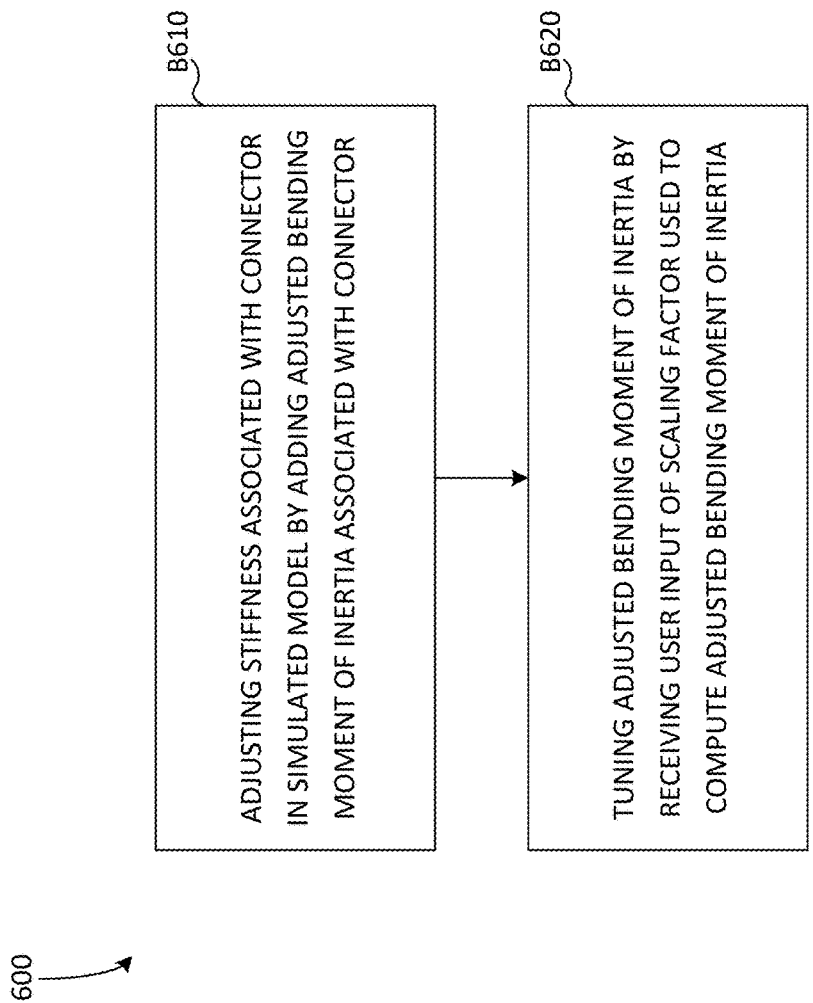
FIG. 6 is a process flow diagram illustrating an example of a stiffness management method for managing stiffness of a connector of a model according to various embodiments.

FIG. 6 is a process flow diagram illustrating an example of a stiffness management method 600 for managing stiffness of a connector of a model according to various embodiments. Referring to FIGS. 1-6, at block B610, the stiffness control module 120 can adjust the stiffness associated with the connector in the simulated model by adding the adjusted bending moment of inertia associated with the connector ($J_{connector}$). $J_{connector}$ can be determined based on the scaling factor, the area of the patch or a portion thereof ($A_{patch}$) and the area of the connector ($A_{connector}$). $A_{patch}$ is a function of mesh Discretization Process as $A_{patch}$ is dependent upon mesh size.

At block B620, the adjusted bending movement of inertia associated with the connector can be tuned by receiving at least one user input of the scaling factor ($SCL_{skin}$) in the manner described.

The terms "system", "logic", "data processing apparatus" or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, networked systems or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions can be executed on any type of computing device (e.g., computer, laptop, etc.) or can be embedded on any type of electronic device (e.g., a portable storage device such as a flash drive, etc.).

Although the figures can show a specific order of method steps, the order of the steps can differ from what is depicted. Also, two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps

What is claimed is:

1. A method for a computer simulation system to control stiffness associated with a connector connecting two or more components of a computer model representing a physical object, comprising:

receiving, via a user interface of the computer simulation system, user input of a scaling factor;

adjusting the stiffness associated with the connector by adjusting a bending moment of inertia of a patch of one of the two or more components based on the scaling factor, wherein
  the connector contacts the one of the two or more components at the patch;
  the bending moment of inertia of the patch is adjusted by adding an adjusted bending moment of inertia associated with the connector; and
  the adjusted bending moment of inertia associated with the connector corresponds to a ratio of a moment of inertia of the patch over a moment of inertia of the connector; and
performing a computer simulation of the computer model based on the adjusted stiffness associated with the connector in order to improve correlation of simulation results of the connector with physical test results of a portion of the physical object corresponding to the connector.

2. The method of claim 1, wherein:
the adjusted bending moment of inertia associated with the connector is the scaling factor multiplied by a ratio of a first area over a second area;
the first area is an area of the patch; and
the second area is an area of the connector.

3. The method of claim 2, wherein:
the computer model is a Finite Element (FE) model; and
the area of the patch is a function of a mesh size of the FE model.

4. The method of claim 1, wherein:
the patch comprises at least one shell element; and
each of the at least one shell element comprises at least one mesh element.

5. The method of claim 1, wherein the connector represents at least welding.

6. The method of claim 5, wherein the welding is in ground transport structures comprising at least trains and automotive.

7. The method of claim 5, wherein the welding is one of a rivet, plug-friction lock, lock-bolt-fastener, screw, discretized bolt, or sheet spring nuts.

8. The method of claim 1, wherein the computer model is a Finite Element (FE) model.

9. A non-transitory computer-readable medium for storing computer-readable instructions such that, when executed, cause a processor of a computer simulation system to perform a method for controlling stiffness associated with a connector connecting two or more components of a computer model representing a physical object, the method comprising:
  receiving, via a user interface of the computer simulation system, user input of a scaling factor;
  adjusting stiffness associated with the connector by adjusting a bending moment of inertia of a patch of one of the two or more components based on the scaling factor, wherein
    the connector contacts the one of the two or more components at the patch;
    the bending moment of inertia of the patch is adjusted by adding an adjusted bending moment of inertia associated with the connector; and
    the adjusted bending moment of inertia associated with the connector corresponds to a ratio of a moment of inertia of the patch over a moment of inertia of the connector; and
  performing a computer simulation of the computer model based on the adjusted stiffness associated with the connector in order to improve correlation of simulation results of the connector with physical test results of a portion of the physical object corresponding to the connector.

10. The non-transitory computer-readable medium of claim 9, wherein:
the adjusted bending moment of inertia associated with the connector is the scaling factor multiplied by a ratio of a first area over a second area;
the first area is an area of the patch; and
the second area is an area of the connector.

11. The non-transitory computer-readable medium of claim 10, wherein:
the model is a Finite Element (FE) model; and
the area of the patch is a function of a mesh size of the FE model.

12. The non-transitory computer-readable medium of claim 9, wherein:
the patch comprises at least one shell element; and
each of the at least one shell element comprises at least one mesh.

13. The non-transitory computer-readable medium of claim 9, wherein the connector represents at least welding.

14. The non-transitory computer-readable medium of claim 13, wherein the welding is in ground transport structures comprising at least trains and automotive.

15. The non-transitory computer-readable medium of claim 13, wherein the welding is one of a rivet, plug-friction lock, lock-bolt-fastener, screw, discretized bolt, or sheet spring nuts.

16. A computer simulation system for controlling stiffness associated with a connector connecting two or more components of a computer model representing a physical object, comprising:
  a user interface;
  a memory; and
  a processor configured to:
    receive, via the user interface of the computer simulation system, user input of a scaling factor;
    adjust the stiffness associated with the connector by adjusting a bending moment of inertia of a patch of one of the two or more components based on the scaling factor, wherein
      the connector contacts the one of the two or more components at the patch;
      the bending moment of inertia of the patch is adjusted by adding an adjusted bending moment of inertia associated with the connector; and
      the adjusted bending moment of inertia associated with the connector corresponds to a ratio of a moment of inertia of the patch over a moment of inertia of the connector; and
    perform a computer simulation of the computer model based on the adjusted stiffness associated with the connector in order to improve correlation of simulation results of the connector with physical test results of a portion of the physical object corresponding to the connector.

* * * * *